(12) United States Patent
Kim et al.

(10) Patent No.: US 12,493,144 B2
(45) Date of Patent: Dec. 9, 2025

(54) COLOR CONVERSION PANEL AND DISPLAY DEVICE INCLUDING THE SAME

(71) Applicant: Samsung Display Co., LTD., Yongin-si (KR)

(72) Inventors: Jeong Ki Kim, Hwaseong-si (KR); Jang-Il Kim, Asan-si (KR); Jong-Hoon Kim, Seoul (KR); Kyoung Hae Min, Asan-si (KR); Seong Yeon Lee, Asan-si (KR); Seok-Joon Hong, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 717 days.

(21) Appl. No.: 17/874,169

(22) Filed: Jul. 26, 2022

(65) Prior Publication Data

US 2023/0080859 A1 Mar. 16, 2023

(30) Foreign Application Priority Data

Sep. 14, 2021 (KR) .......................... 10-2021-0122330

(51) Int. Cl.
| | | |
|---|---|---|
| *H01L 27/32* | (2006.01) | |
| *G02B 5/20* | (2006.01) | |
| *G02B 5/26* | (2006.01) | |
| *H10K 59/122* | (2023.01) | |
| *H10K 59/38* | (2023.01) | |
| *H10K 102/00* | (2023.01) | |

(52) U.S. Cl.
CPC .............. *G02B 5/201* (2013.01); *G02B 5/26* (2013.01); *H10K 59/122* (2023.02); *H10K 59/38* (2023.02); *H10K 2102/331* (2023.02)

(58) Field of Classification Search
CPC ........ G02B 5/201; G02B 5/26; H10K 59/122; H10K 59/38; H10K 2102/331
See application file for complete search history.

(56) References Cited

U.S. PATENT DOCUMENTS

| 12,154,936 | B2* | 11/2024 | Suh .................... H01L 25/0753 |
| 2021/0005672 | A1* | 1/2021 | Lee ...................... H10K 59/38 |
| 2021/0202587 | A1* | 7/2021 | Kim .................... H10K 50/844 |
| 2022/0131038 | A1* | 4/2022 | Park ..................... H10H 20/83 |
| 2022/0199694 | A1* | 6/2022 | Bae ................... H10K 59/8792 |
| 2022/0199695 | A1* | 6/2022 | Takiguchi ............... G02B 5/20 |

(Continued)

FOREIGN PATENT DOCUMENTS

| KR | 10-2018-0066936 A | 6/2018 |
| KR | 10-2019-0050886 A | 5/2019 |

(Continued)

*Primary Examiner* — Jarrett J Stark
(74) *Attorney, Agent, or Firm* — Womble Bond Dickinson (US) LLP

(57) ABSTRACT

A color conversion panel and a display device are provided to include: substrate; a transparent filter layer and a plurality of first partitioning wall layers that are on the substrate; a first refractive layer that is on the transparent filter layer and the plurality of first partitioning wall layers; a plurality of second partitioning wall layers that are on the first refractive layer, and overlap the plurality of first partitioning wall layers; and a plurality of color conversion layers that are on the first refractive layer, and in a region defined by the plurality of first partitioning wall layers and the plurality of second partitioning wall layers.

20 Claims, 11 Drawing Sheets

(56) References Cited

U.S. PATENT DOCUMENTS

2022/0209193 A1* 6/2022 Shin .................... H10K 59/877
2023/0080859 A1* 3/2023 Kim ........................ G02B 5/26
                                                          257/91

FOREIGN PATENT DOCUMENTS

| KR | 10-2020-0111325 A | 9/2020 |
| KR | 10-2021-0003993 A | 1/2021 |
| WO | WO 2022/025365 A1 | 2/2022 |

* cited by examiner

COLOR CONVERSION PANEL AND DISPLAY DEVICE INCLUDING THE SAME

CROSS-REFERENCE TO RELATED APPLICATION

This application claims priority to and the benefit of Korean Patent Application No. 10-2021-0122330, filed in the Korean Intellectual Property Office on Sep. 14, 2021, the entire content of which is incorporated herein by reference.

BACKGROUND

1. Field

The present disclosure relates to a color conversion panel and a display device including the same.

2. Description of the Related Art

In order to reduce light loss of a display device and display high-efficiency colors, a color conversion panel and a display device including the same have been proposed. For example, it is desired to increase the efficiency of the color converted light in the color conversion panel.

The above information disclosed in this Background section is only for enhancement of understanding of the background of the described technology, and therefore it may contain information that does not form the prior art that is already known to a person of ordinary skill in the art.

SUMMARY

Aspects of embodiments are directed toward a color conversion panel that can increase color conversion efficiency of a color conversion panel and a display device including the same. For example, the color conversion panel can provide an increase in color conversion efficiency and reduce the loss of light.

However, the problems to be solved by the embodiments are not limited to the above-described problems and may be variously (suitably) expanded in the range of the technical ideas included in the embodiments.

A color conversion panel according to an embodiment includes: a substrate; a transparent filter layer and a plurality of first partitioning wall layers that are on the substrate; a first refractive layer that is on the transparent filter layer and the plurality of first partitioning wall layers; a plurality of second partitioning wall layers that are on the first refractive layer, and overlap the plurality of first partitioning wall layers; and a plurality of color conversion layer that are on the first refractive layer, and in a region defined by the plurality of first partitioning wall layers and the plurality of second partitioning wall layers.

The transparent filter layer and the plurality of first partitioning wall layers may include a plurality of scatterers (light scatterers), and may have photosensitivity.

The color conversion panel may further include a first color filter, a second color filter, and a third color filter that are on the substrate, wherein the transparent filter layer may overlap the first color filter, and the plurality of color conversion layers may overlap the second color filter and the third color filter.

The plurality of color conversion layers may include a plurality of quantum dots.

The transparent filter layer and the first color filter may transmit light of a first wavelength, and the plurality of color conversion layers may include a first color conversion layer that color-converts the light of the first wavelength into light of a second wavelength, and a second color conversion layer that color-converts the light of the first wavelength to light of a third wavelength.

The first color conversion layer may overlap the second color filter and the second color filter may transmit the light of the second wavelength, and the second color conversion layer may overlap the third color filter and the third color filter may transmit the light of the third wavelength.

The color conversion panel may further include a second refractive layer that is on the first refractive layer, wherein a refractive index of the first refractive layer may be different from that of the second refractive layer.

The color conversion panel may further include a third color conversion layer that overlaps the transparent filter layer.

The surface height of the third color conversion layer may be substantially the same as the average surface height of the plurality of color conversion layers.

The third color conversion layer may include a quantum dot or a color filter.

A display device according to an embodiment includes: a first substrate; a pixel electrode that is on the first substrate; a pixel defining film that is on the pixel electrode and includes an opening overlapping the pixel electrode; an emission layer that is in the pixel opening; a common electrode that is in the emission layer; a second substrate that faces the first substrate; a transparent filter layer and a plurality of first partitioning wall layers that are between the first substrate and the second substrate; a first refractive layer that is between the first substrate, the transparent filter layer, and the plurality of first partitioning wall layers; a plurality of second partitioning wall layers that are between the first refractive layer and the first substrate, and are overlapping the plurality of first partitioning wall layers (in a plan view); and a plurality of color conversion layers that are between the first refractive layer and the first substrate.

The color conversion panel and the display device including the same according to the embodiments can increase color conversion efficiency of the color conversion panel.

However, the effects of the embodiments are not limited to the above-described effects, and it is apparent that the embodiments can be variously (suitably) expanded within a range that does not deviate from the spirit and scope of the embodiments.

DETAILED DESCRIPTION

Figure 1:
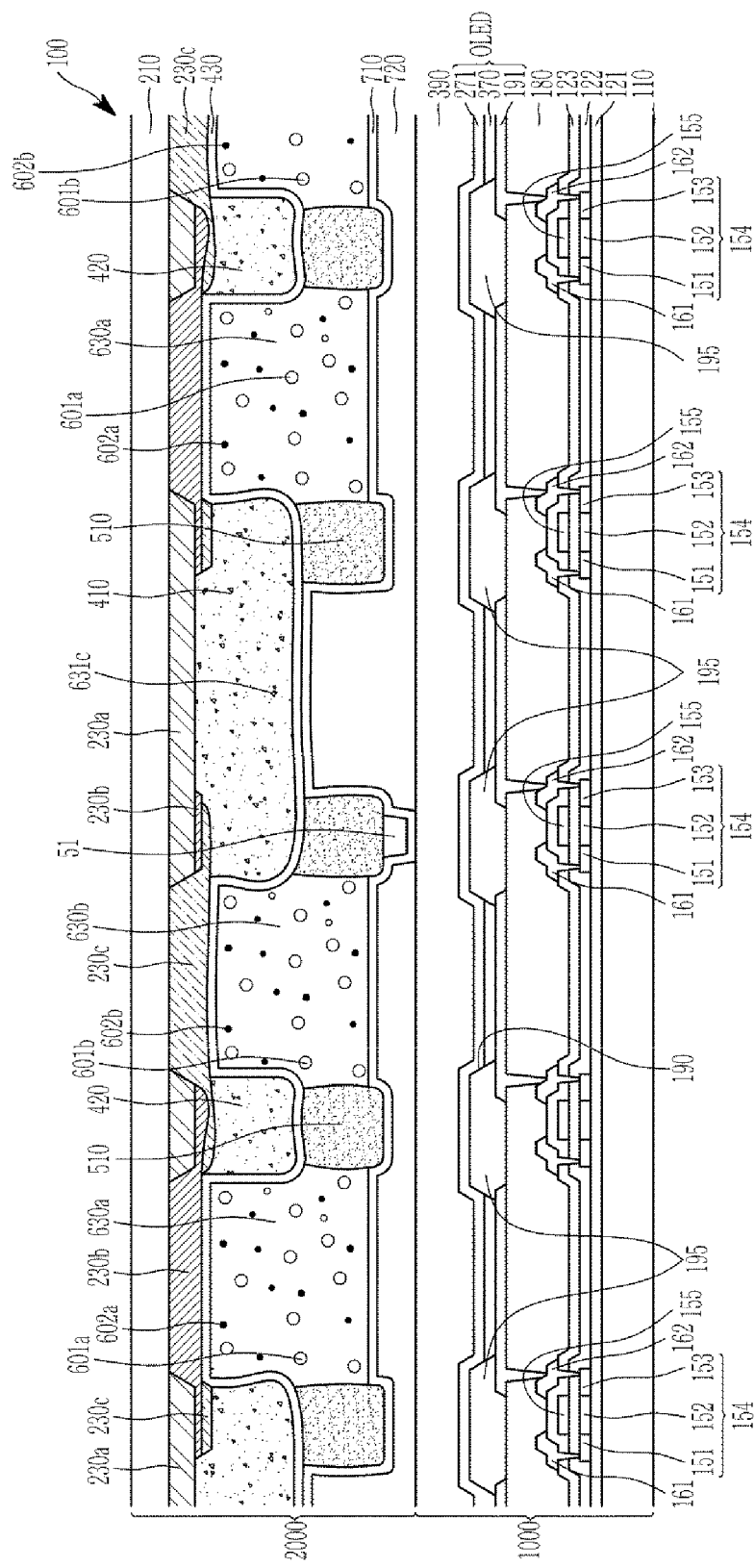
FIG. 1 is a cross-sectional view of a display device according to an embodiment.

The embodiments will be described more fully hereinafter with reference to the accompanying drawings, in which embodiments are shown. As those skilled in the art would realize, the described embodiments may be modified in one or more suitable different ways.

The drawings and description are to be regarded as illustrative in nature and not restrictive. Like reference numerals designate like elements throughout, and duplicative descriptions thereof may not be provided in the disclosure.

In some embodiments, the attached drawing is only for easy understanding of the embodiment disclosed in the present disclosure, and the technical idea disclosed in the disclosure is not limited by the attached drawing, and it should be understood that all changes, equivalents, or substitutes are included in the spirit and scope of the embodiments.

In some embodiments, because the size and thickness of each configuration shown in the drawings are arbitrarily indicated for better understanding and ease of description, the embodiments are not necessarily limited to the drawings. In the drawings, the thickness of layers, films, panels, regions, etc., may be exaggerated for clarity. In some embodiments, in the drawings, the thickness of some layers and regions may be exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the disclosure, the word "on" a target element will be understood to refer to positioned above or below the target element, and will not necessarily be understood to refer to positioned "at an upper side" based on an opposite to gravity direction.

In some embodiments, unless explicitly described to the contrary, the word "comprise", and variations such as "comprises" or "comprising" will be understood to imply the inclusion of stated elements but not the exclusion of any other elements.

Further, throughout the disclosure, the phrase "on a plane" refers to viewing a target portion from the top, and the phrase "on a cross-section" refers to viewing a cross-section formed by vertically cutting a target portion from the side.

In some embodiments, when "connected to (coupled to)" in the entire disclosure, this does not only refer to that two or more constituent elements are directly connected (coupled), but also refers to that two or more constituent elements are indirectly connected, physically connected, and electrically connected through other constituent elements, or being referred to by different names depending on the position or function, while being integral.

Hereinafter, one or more suitable embodiments and example variations will be described in more detail with reference to the drawings.

Referring to FIG. 1, a display device according to an embodiment will be briefly described. FIG. 1 is a cross-sectional view of a display device according to an embodiment.

Referring to FIG. 1, a display device 100 includes a display panel 1000 and a color conversion panel 2000. The display device may include a touch portion, and the touch portion may be between the display panel 1000 and the color conversion panel 2000.

First, the display panel 1000 will be described.

The display panel 1000 includes a first substrate 110, and a buffer layer 121 is on the first substrate 110. The first substrate 110 may include a flexible material such as plastic that can be twisted, bent, folded, or rolled.

The buffer layer 121 may include a silicon nitride ($SiN_x$) and/or a silicon oxide ($SiO_x$). The buffer layer 121 is between the first substrate 110 and the semiconductor layer 154, and blocks (reduces) impurities from the first substrate 110 during the crystallization process to form polysilicon to thereby improve the characteristics of polysilicon, and flatten the first substrate 110 to release stress of the semiconductor layer 154 formed on the buffer layer 121.

The semiconductor layer 154 is on the buffer layer 121. The semiconductor layer 154 may be formed of a polysilicon or an oxide semiconductor. The semiconductor layer 154 may include a channel region 152, a source region 151, and a drain region 153. The source region 151 and the drain region 153 may be respectively at opposite sides of the channel region 152. The channel region 152 is an undoped intrinsic semiconductor, and the source region 151 and the drain region 153 may be impurity semiconductors doped with a conductive impurity. The semiconductor layer 154 may be formed of an oxide semiconductor. In this case, a separate protective layer may be added to protect the oxide semiconductor material, which is vulnerable to external environments such as a high temperature.

A gate insulating layer 122 is on the semiconductor layer 154 to cover the semiconductor layer 154. The gate insulating layer 122 may be a single layer or multiple layers including at least one compound selected from a silicon nitride (SiNx) and a silicon oxide ($SiO_x$).

A gate electrode 155 is on the gate insulating layer 122. The gate electrode 155 may be a multilayer in which a metal film including any one of copper (Cu), a copper alloy, aluminum (Al), an aluminum alloy, molybdenum (Mo), and a molybdenum alloy is stacked.

An interlayer insulating layer 123 is on the gate electrode 155 and the gate insulating layer 122. The interlayer insulating layer 123 may include a silicon nitride (SiNx) and/or a silicon oxide ($SiO_x$). An opening exposing the source region 151 and the drain region 153 is in the interlayer insulating layer 123.

A source electrode 161 and a drain electrode 162 may be formed on the interlayer insulating layer 123. The source electrode 161 and the drain electrode 162 may be connected (coupled) to the source region 151 and the drain region 153 of the semiconductor layer 154 through openings formed in the interlayer insulating layer 123 and the gate insulating layer 122, respectively.

A protective layer 180 is on the interlayer insulating layer 123, the source electrode 161, and the drain electrode 162. The protective layer 180 covers and flattens the interlayer insulating layer 123, the source electrode 161, and the drain electrode 162 such that the pixel electrode 191 may be formed on the protective layer 180 without a step. The protective layer 180 may be formed of an organic material such as a polyacryl-based resin, a polyimide resin, and/or a laminated film of an organic material and/or an inorganic material.

The pixel electrode 191 is on the protective layer 180. The pixel electrode 191 is connected (coupled) to the drain electrode 162 through an opening of the protective layer 180.

A driving transistor formed of the gate electrode 155, the semiconductor layer 154, the source electrode 161, and the drain electrode 162 may be connected to the pixel electrode 191 and supplies a driving current to an organic light emitting diode OLED. The display device according to the present embodiment may further include a switching transistor that is connected to the data line 171 and transmits a data voltage in response to a scan signal and a compensation transistor that is connected with (e.g., to) the driving transistor and compensates a threshold voltage of the driving transistor in response to the scan signal.

A pixel defining layer (e.g., a pixel defining film) 195 is on the protective layer 180 and the pixel electrode 191, and the pixel defining film 195 may include a pixel opening 190 that overlaps the pixel electrode 191 and defines a light emitting region (in a plan view). The pixel defining film 195 may include an organic material such as a polyacryl-based resin, a polyimide resin, and/or a silica-based inorganic material. The pixel opening 190 may have a planar shape substantially similar to that of the pixel electrode 191, and may have a rhombus or octagonal shape similar to a rhombus on a plane (in a plan view), but is not limited thereto, and may have any suitable shape such as a quadrangle or a polygon.

An organic emission layer 370 is on the pixel electrode 191 overlapping the pixel opening 190. The organic emission layer 370 may be formed of a low molecular organic material or a high molecular organic material such as poly(3,4-ethylenedioxythiophene) (PEDOT). In some embodiments, the organic emission layer 370 may be a multilayer further including one or more selected from a hole injection layer (HIL), a hole transporting layer (HTL), an electron transport layer (ETL), and an electron injection layer (EIL).

The organic emission layer 370 may be mostly within the pixel opening 190, and may also be on or on the side of the pixel defining film 195.

A common electrode 271 is on the organic emission layer 370. The common electrode 271 may be disposed over a plurality of pixels, and a common voltage may be applied through a common voltage transfer unit in the non-display area.

The pixel electrode 191, the organic emission layer 370, and the common electrode 271 may form an organic light emitting diode OLED.

Here, the pixel electrode 191 may be an anode, e.g., a hole injection electrode, and the common electrode 271 may be a cathode, e.g., an electron injection electrode. However, the present embodiment is not limited thereto, and the pixel electrode 191 may be a cathode and the common electrode 271 may be an anode depending on a driving method of the organic light emitting display device.

Holes and electrons may be injected into the organic emission layer 370 from the pixel electrode 191 and the common electrode 271, respectively, and light is emitted when excitons, in cases in which the injected holes and electrons are combined, fall from an exited state to a ground state.

An encapsulation layer 390 may be placed on the common electrode 271. The encapsulation layer 390 may cover an upper surface in addition to side surfaces of a display layer including the organic light emitting diode OLED to seal the display layer.

Because organic light emitting diodes may be vulnerable to moisture and oxygen, the encapsulation layer 390 seals the display layer to block or reduce the inflow of external moisture and oxygen. The encapsulation layer 390 may include a plurality of layers, may be formed as a composite film including both (e.g., simultaneously) an inorganic film and an organic film, and may be formed as a triple layer in which an inorganic film, an organic film, and an inorganic film may be sequentially formed.

A color conversion panel 2000 is on the encapsulation layer 390.

The color conversion panel 2000 includes a second substrate 210 facing a first substrate 110 of the display panel 1000. The second substrate 210 may contain a flexible material such as plastic that can be twisted, bent, folded, and/or rolled.

A first color filter 230a, a second color filter 230b, a third color filter 230c, a transparent filter layer 410, a plurality of first partitioning wall layers 420, a first refractive layer 430, a plurality of second partitioning wall layers 510, a spacer 51, a plurality of first color conversion layers 630a, a plurality of second color conversion layers 630b, and a cover layer 710 may be between the second substrate 210 and the display panel 1000.

The first color filter 230a, the second color filter 230b, and the third color filter 230c on the second substrate 210 may overlap each other at positions overlapping the pixel defining layer (e.g., film) 195 of the display panel 1000 (in a plan view), and the first color filter 230a, the second color filter 230b, and the third color filter 230c can also serve as a light blocking member by being overlapped, thereby blocking (reducing) light.

The pixel opening 190 of the pixel defining film 195 may overlap a corresponding one selected from the plurality of first color conversion layers 630a, the plurality of second color conversion layers 630b, and the transparent filter layer 410 (in a plan view).

An edge portion of the transparent filter layer 410, the plurality of first partitioning wall layers 420, and the plurality of second partitioning wall layers 510 may overlap the pixel defining film 195 of the display panel 1000 (in a plan view).

The edge portion of the transparent filter layer 410 and the plurality of first partitioning wall layers 420 overlapping the pixel defining film 195 may overlap the plurality of second partitioning wall layers 510 (in a plan view).

The edge portion of the transparent filter layer 410 may overlap the pixel defining film 195, and a center portion of the transparent filter layer 410 may be in a region where the first color filter 230a and the pixel opening 190 overlap each other (in a plan view).

The plurality of first color conversion layers 630a may be in a region where the second color filter 230b and the pixel opening 190 overlap each other among regions defined by the edge portion of the transparent filter layer 410, the plurality of first partitioning wall layers 420, and the plurality of second partitioning wall layers 510 (in a plan view), and the plurality of second color conversion layer 630b may be in a region where the third color filter 230c and pixel opening 190 overlap each other among regions defined by the edge portion of the transparent filter layer 410, the plurality of first partitioning wall layers 420, and the plurality of second partitioning wall layers 510 (in a plan view).

The organic light emitting diode OLED of the display panel 1000 may emit light of a first wavelength, and the transparent filter layer 410 may transmit light of the first wavelength and may include a plurality of scatterers 631c. The plurality of first partitioning wall layers 420 may transmit the light of the first wavelength like the transparent filter layer 410, and may include a plurality of scatterers 631c. The transparent filter layer 410 and the plurality of first partitioning wall layers 420 may have photosensitivity, and the plurality of scatterers 631c may contain titanium dioxide ($TiO_2$). The transparent filter layer 410 and the plurality of first partitioning wall layers 420 may further include a color conversion material that converts incident light into light of the first wavelength, and may further include a color filter through which the light of the first wavelength passes.

The first color conversion layer 630*a* converts light of the first wavelength, incident from the display panel 1000, into light of a second wavelength, and includes a plurality of first quantum dots 601*a* and a plurality of scatterers 602*a*. The second color conversion layer 630*b* converts light of the first wavelength, incident from the display panel 1000, into light of a third wavelength, and includes a plurality of second quantum dots 601*b* and a plurality of scatterers 602*b*.

The light of the first wavelength may be blue light that has a maximum light emitting peak wavelength of about 380 nm to about 480 nm, for example, about 420 nm or more, about 430 nm or more, about 440 nm or more, or about 445 nm or more, and about 470 nm or less, about 460 nm or less, or about 455 nm.

The light of the second wavelength may be red light having a maximum light emitting peak wavelength of about 600 nm to about 650 nm, for example, about 620 nm to about 650 nm.

The light of the third wavelength may be green light having a maximum light emitting peak wavelength of about 500 nm to about 550 nm, for example, about 510 nm to about 550 nm.

The first color filter 230*a* may transmit the light of the first wavelength that has passed through the transparent filter layer 410 and absorb the light of the remaining wavelength such that the light of the first wavelength that is light emitting toward the second substrate 210 after passing through the transparent filter layer 410 may have improved purity. The second color filter 230*b* may transmit the light of the second wavelength and absorb the light of the remaining wavelength, and thus light of the second wavelength emitted toward the second substrate 210 after passing through the first color conversion layer 630*a* and being color-converted may have improved (increased) purity, and similarly, the third color filter 230*c* may transmit the light of the third wavelength and absorb the light of the remaining wavelength, and thus light of the third wavelength emitted toward the second substrate 210 after passing through the second color conversion layer 630*b* and being color-converted may have improved (increased) purity.

The first color filter 230*a*, the second color filter 230*b*, and the third color filter 230*c*, which overlap each other at a position overlapping with the pixel defining film 195, block or reduce the light of the first wavelength, the light of the second wavelength, and the light of the third wavelength, and thus the purity of light emitting toward the second substrate 210 can be increased.

A first refractive layer 430 that covers the transparent filter layer 410 and the plurality of first partitioning wall layers 420 refracts light passed through the transparent filter layer 410, the first color conversion layer 630*a*, and the second color conversion layer 630*b*, and the refracted light may be emitted to the outside again, thereby increasing light efficiency.

In some embodiments, a plurality of scatterers 631*c* in the transparent filter layer 410 and the plurality of first partitioning wall layers 420 reflect light incident on the transparent filter layer 410, and the reflected light may be emitted to the outside again, thereby increasing light efficiency.

The transparent filter layer 410 and the plurality of first partitioning wall layers 420 may be formed together in substantially the same layer, whereby the manufacturing process may not be complicated.

In some embodiments, the plurality of second partitioning wall layers 510 overlapping an edge portion of the transparent filter layer 410 and the plurality of first partitioning wall layers 420 may increase a height of a region in which the first color conversion layer 630*a* and the second color conversion layer 630*b* may be disposed, and accordingly, a region in which the first color conversion layer 630*a* and the second color conversion layer 630*b* may be disposed may be sufficiently (suitably) defined.

A distance between the display panel 1000 and the transparent filter layer 410, the first color conversion layer 630*a*, and the second color conversion layer 630*b* may be kept constant by the spacer 51 protruded from a part of the plurality of the second partitioning wall layers 510.

A cover layer 710 is on the transparent filter layer 410, the first color conversion layer 630*a*, and the second color conversion layer 630*b*.

The color conversion panel 2000 may be attached to face the display panel 1000, and a filling layer 720 may be between the display panel 1000 and the color conversion panel 2000. The cover layer 710 on the transparent filter layer 410, the first color conversion layer 630*a*, and the second color conversion layer 630*b* prevents or reduces components of the filling layer 720 from flowing into the transparent filter layer 410, the first color conversion layer 630*a*, and the second color conversion layer 630*b*.

Figure 2:
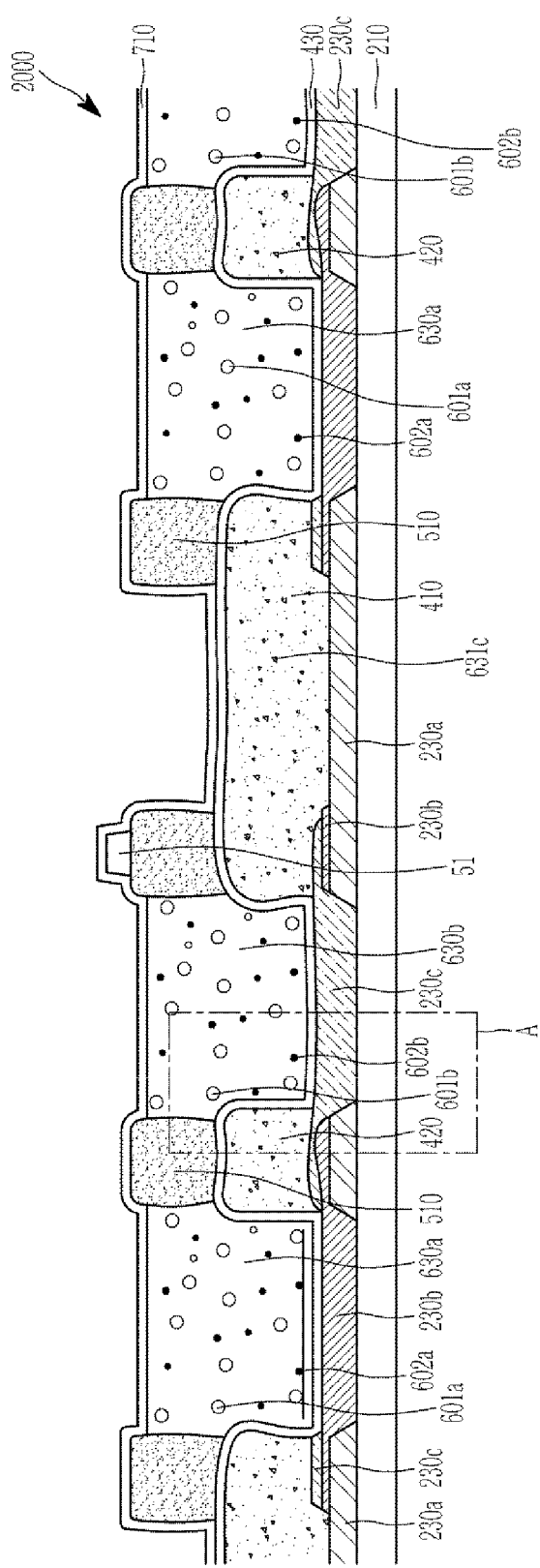
FIG. 2 is a cross-sectional view of a color conversion panel according to an embodiment.

Next, referring to FIG. 1 and FIG. 2, a color conversion panel 2000 according to an embodiment will be described in more detail. FIG. 2 is a cross-sectional view of a color conversion panel according to an embodiment.

Referring to FIG. 2 together with FIG. 1, a color conversion panel 2000 according to an embodiment includes a second substrate, and a first color filter 230*a*, a second color filter 230*b*, and a third color filter 230*c* on the second substrate 210.

The second substrate 210 may contain a flexible material such as plastic that can be twisted, bent, folded, and/or rolled.

Parts of the first color filter 230*a*, the second color filter 230*b*, and the third color filter 230*c* overlap each other to serve as a light blocking member such that light passed through each of the transparent filter layer 410, the first color conversion layer 630*a*, and the second color conversion layer 630*b* can be prevented or reduced from being mixed and viewed, thereby improving a contrast ratio of the display device.

A transparent filter layer 410 and a plurality of first partitioning wall layers 420 may be on the first color filter 230*a*, the second color filter 230*b*, and the third color filter 230*c*.

The transparent filter layer 410 may be disposed to be overlapped with the first color filter 230*a*.

The transparent filter layer 410 and the plurality of first partitioning wall layers 420 may be formed together in substantially the same layer, and accordingly a manufacturing process may not be complicated. The transparent filter layer 410 and the plurality of first partitioning wall layers 420 may include a plurality of scatterers 631*c*. The transparent filter layer 410 and the plurality of first partitioning wall layers 420 may further include a color conversion material that converts the incident light into light of a first wavelength, and may further include a color filter that transmits light of the first wavelength.

A first refractive layer 430 that covers the transparent filter layer 410, the plurality of first partitioning wall layers 420, the first color filter 230*a*, the second color filter 230*b*, and the third color filter 230*c* may increase light efficiency by refracting light passed through the transparent filter layer 410, the first color conversion layer 630*a*, and the second color conversion layer 630b, and concurrently (e.g., simultaneously) prevents or reduces diffusion of components of the first color filter 230a, the second color filter 230b, and the third color filter 230c to the outside.

A plurality of second partitioning wall layers 510 may be on an edge portion of the transparent filter layer 410 and the plurality of first partitioning wall layers 420.

The plurality of first partitioning wall layers 420 and the plurality of second partitioning wall layers 510 may define regions in which the plurality of first color conversion layers 630a and the plurality of second color conversion layers 630b may be disposed.

The plurality of second partitioning wall layers 510 overlapping the edge portion of the transparent filter layer 410 and the plurality of first partitioning wall layers 420 may increase a height of a region in which the first color conversion layer 630a and the second color conversion layer 630b may be disposed, and accordingly, the regions in which the first color conversion layer 630a and the second color conversion layer 630b can be sufficiently (suitably) defined.

The plurality of first partitioning wall layers 420 and the plurality of second partitioning wall layers 510 overlapping each other may have substantially the same flat area.

A distance between the display panel 1000 and the transparent filter layer 410, the first color conversion layer 630a, and the second color conversion layer 630b may be kept constant by the spacer 51 protruded from a part of the plurality of the second partitioning wall layers 510.

The first color conversion layer 630a and the second color conversion layer 630b may be in a region defined by an edge portion of the transparent filter layer 410, the plurality of first partitioning wall layers 420, and the plurality of second partitioning wall layers 510.

The transparent filter layer 410 may be disposed to overlap the first color filter 230a, the first color conversion layer 630a may be disposed to overlap the second color filter 230b, and the second color conversion layer 630b may be disposed to overlap the third color filter 230c.

The display panel 1000 emitting light to the color conversion panel 2000 may emit light of a first wavelength, the transparent filter layer 410 transmits the light of the first wavelength, and the plurality of scatterers 631c included in the transparent filter layer 410 and the plurality of first partitioning wall layers 420 may scatter light incident on the transparent filter layer 410 and the plurality of first partitioning wall layers 420, thereby increasing light efficiency.

The first color conversion layer 630a color-converts the light of the first wavelength incident from the display panel 1000 into light of a second wavelength, and includes a plurality of scatterers 602a and a plurality of first quantum dots 601a. The second color conversion layer 630b color-converts the light of the first wavelength incident from the display panel 1000 into light of a third wavelength, and includes a plurality of scatterers 602b and a plurality of second quantum dots 601b.

The light of the first wavelength may be blue light having a maximum light emitting peak wavelength of about 380 nm to about 480 nm, for example, about 420 nm or more, about 430 nm or more, about 440 nm or more, or about 445 nm or more, and about 470 nm or less, about 460 nm or less, or about 455 nm or less.

The light of the second wavelength may be red light having a maximum light emitting peak wavelength of about 600 nm to about 650 nm, for example, about 620 nm to about 650 nm.

The light of the third wavelength may be green light having a maximum light emitting peak wavelength of about 500 nm to about 550 nm, for example, about 510 nm to about 550 nm.

The first quantum dot 601a and the second quantum dot 601b may be selected from a group II-VI compound, a group III-V compound, a group IV-VI compound, a group IV element, a group IV compound, and a combination thereof.

The group II-VI compound may be selected from the group consisting of a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof. The group III-V compound may be selected from a group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and mixtures thereof. The group IV-VI compound may be selected from a group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The group IV element may be selected from the group consisting of Si, Ge, and mixtures thereof. The group IV compound may be a binary compound selected from the group consisting of SiC, SiGe, and mixtures thereof.

In an embodiment, the above-mentioned binary compound, the ternary element compound, and/or the quaternary compound may exist in a particle at a substantially uniform concentration, or may exist in substantially the same particle because the concentration distribution is partially divided into different states. In some embodiments, one quantum dot may have a core/shell structure around (e.g., surrounding) another quantum dot. The interface between the core and the shell may have a concentration gradient in which the concentration of elements present in the shell decreases toward the center.

In some embodiments, the shape of the quantum dot is not for example, limited to that generally utilized in the art, but for example, it can be utilized in the form of a spherical, pyramidal, multi-armed, or a cubic nanoparticle, nanotube, nanowires, nano fibers, nano plate-shaped particles, and/or the like.

A cover layer 710 is on the transparent filter layer 410, the first color conversion layer 630a, and the second color conversion layer 630b. The cover layer 710 protects the transparent filter layer 410, the first color conversion layer 630a, and the second color conversion layer 630b by covering them, and thus, components of the filling layer 720 injected when the color conversion panel 2000 is attached to the display panel 1000 can be prevented or reduced from flowing into the transparent filter layer 410, the first color conversion layer 630*a*, and the second color conversion layer 630*b*.

Light of a first wavelength emitted from the display panel 1000 while being adjacent to the display panel 1000 is incident on the transparent filter layer 410, the first color conversion layer 630*a*. Then, the second color conversion layer 630*b*, and the light of the first wavelength is scattered and transmitted in a region where the transparent filter layer 410 is disposed and thus emitted toward the second substrate 210, the light of the first wavelength is converted into light of a second wavelength in a region where the first color conversion layer 630*a* is disposed and thus emitted toward the second substrate 210, and the light of the first wavelength is converted into light of a third wavelength in a region where the second color conversion layer 630*b* is disposed and thus emitted toward the second substrate 210.

In this case, color purity is increased by the layers of the colors 230*a*, 230*b*, and 230*c* between the second substrate 210, the transparent filter layer 410, the first color conversion layer 630*a*, and the second color conversion layer 630*b*.

For example, the first color filter 230*a* can transmit the light of the first wavelength passed through the transparent filter layer 410 and absorb light of the remaining wavelength such that the purity of the light of the first wavelength light emitted toward the second substrate 210 can be increased. The second color filter 230*b* can transmit the light of the second wavelength and absorb light of the remaining wavelength such that the purity of the light of the second wavelength emitted toward the second substrate 210 can be increased, and similarly, the third color filter 230*c* can transmit the light of the third wavelength and absorb light of the remaining wavelength such that the purity of the light of the second wavelength emitted toward the second substrate 210 can be increased.

A first refractive layer 430 covering the transparent filter layer 410 and the plurality of first partitioning wall layers 420 reflects light passed through the transparent filter layer 410, the first color conversion layer 630*a*, and the second color conversion layer 630*b*, and the reflected light can be emitted to the outside again, thereby increasing light efficiency.

In some embodiments, the plurality of scatterers 631*c* in the transparent filter layer 410 and the plurality of first partitioning wall layers 420 reflect light incident on the transparent filter layer 410, and the reflected light can be emitted to the outside again, thereby increasing light efficiency.

Figure 3:
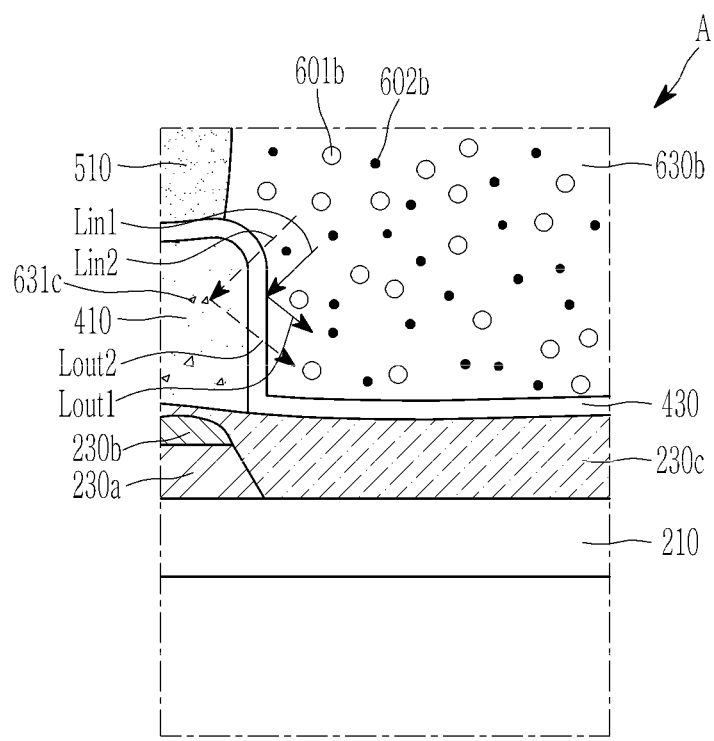
FIG. 3 is an enlarged view of a part of FIG. 2.

This will be described with reference to FIG. 3, together with FIG. 1 and FIG. 2. FIG. 3 is an enlarged view of a part of FIG. 2.

Referring to FIG. 3, together with FIG. 1 and FIG. 2, first light Lin 1 incident on an edge portion of the transparent filter layer 410 and the plurality of first partitioning wall layers (e.g., walls of the layers) 420 in a portion where the first color filter 230*a*, the second color filter 230*b*, and the third color filter 230*c* overlap each other is scattered by the scatterers 631*c* included in the transparent filter layer 410 and the plurality of first partitioning wall layers 420 from the transparent filter layer 410, the first color conversion layer 630*a*, and the second color conversion layer 630*b*, and a path is changed such that second light Lout1 having a changed path may be re-emitted to the transparent filter layer 410, the first color conversion layer 630*a*, and the second color conversion layer 630*b*.

In some embodiments, from the transparent filter layer 410, the first color conversion layer 630*a*, and the second color conversion layer 630*b*, third light Lin2 incident on the first refractive layer 430 at the surfaces of the transparent filter layer 410 and the plurality of first partitioning wall layers 420 in a portion where the first color filter 230*a*, the second color filter 230*b*, and the third color filter 230*c* overlap each other is refracted by the first refractive layer 430 on the first color filter 230*a*, the second color filter 230*b*, the third color filter 230*c*, the transparent filter layer 410, and the plurality of first partitioning wall layers 420 such that refracted fourth light Lout2 may be re-emitted to the transparent filter layer 410, the first color conversion layer 630*a*, and the second color conversion layer 630*b*.

The light incident toward the edge portion of the transparent filter layer 410 and the plurality of first partitioning wall layers 420 from the transparent filter layer 410, the first color conversion layer 630*a*, and the second color conversion layer 630*b* is scattered and refracted and then re-emitted toward the transparent filter layer 410, the first color conversion layer 630*a*, and the second color conversion layer 630*b* such that the light is transmitted or color-converted again and then radiated toward the second substrate 210, thereby increasing the light efficiency.

Next, a manufacturing method of a color conversion panel of a display device according to an embodiment will be described with reference to FIG. 4 to FIG. 8, together with FIG. 1 and FIG. 2. FIG. 4 to FIG. 8 are cross-sectional views that show a method of manufacturing a color conversion panel according to an embodiment of a manufacturing process.

Figure 4:
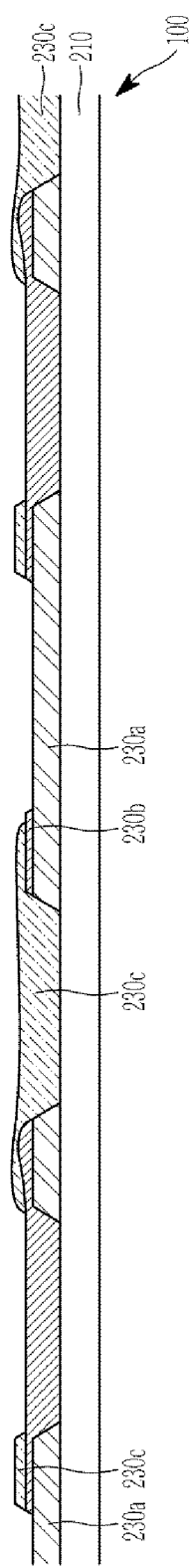
FIGS. 4-8 are cross-sectional views that show a method of manufacturing a color conversion panel according to an embodiment of a manufacturing process.

As shown in FIG. 4, a first color filter 230*a*, a second color filter 230*b*, and a third color filter 230*c* may be sequentially formed on a second substrate 210.

A part of each of the first color filter 230*a*, the second color filter 230*b*, and the third color filter 230*c* may serve as a light blocking member by overlapping each other in a position overlapping with a pixel defining film 195 of a display panel 1000.

Figure 5:
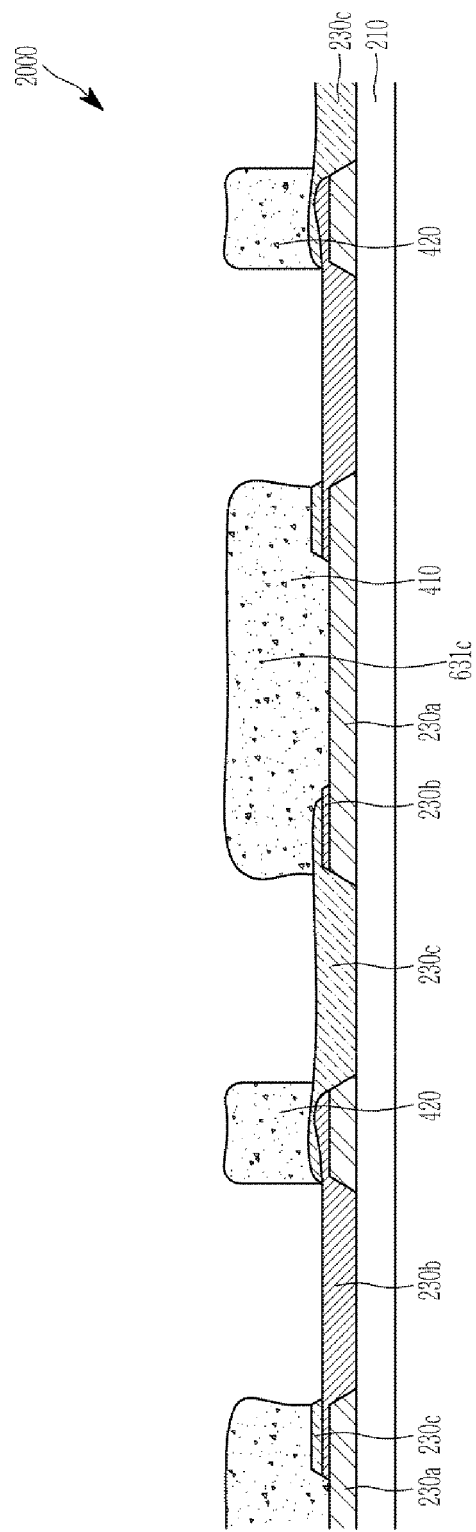

Referring to FIG. 5, a transparent filter layer 410 and a plurality of first partitioning wall layers 420 are formed on the second substrate 210.

The transparent filter layer 410 and the plurality of first partitioning wall layers 420 include a plurality of scatterers 631*c* and may be formed together by utilizing a transparent layer having photosensitivity.

An edge portion of the transparent filter layer 410 and the plurality of first partitioning wall layers 420 may overlap a first color filter 230*a*, a second color filter 230*b*, and a third color filter 230*c* in a position overlapping with the pixel defining film 195.

Most of the transparent filter layer 410 may be formed to overlap the first color filter 230*a*.

Figure 6:
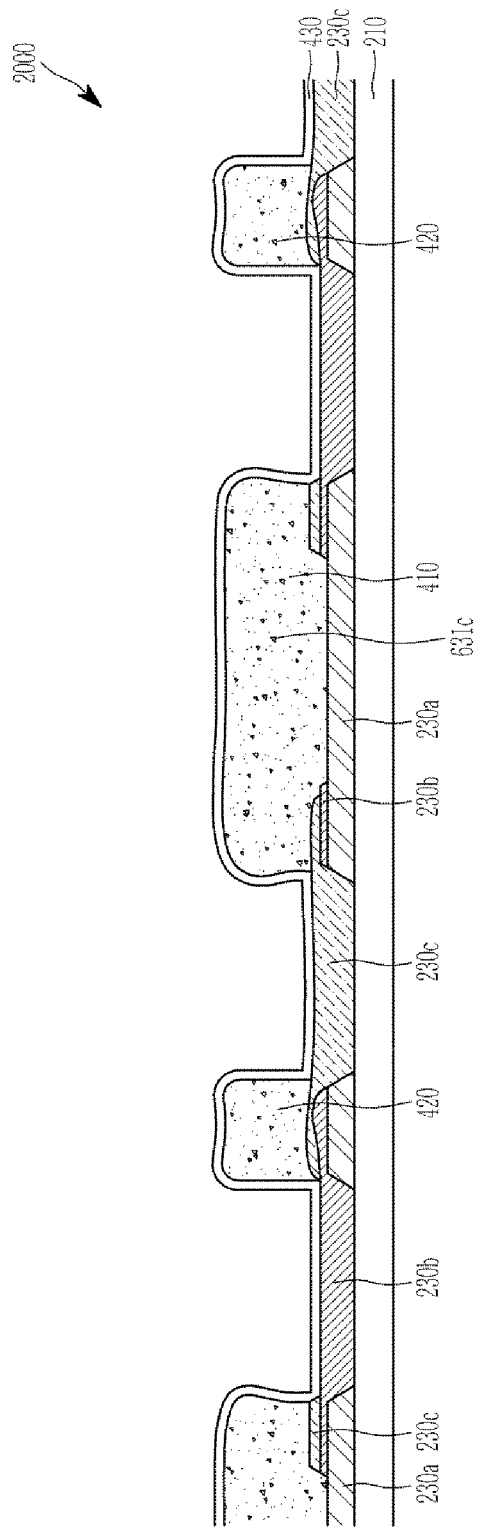

As shown in FIG. 6, the first refractive layer 430 is formed on the first color filter 230*a*, the second color filter 230*b*, the third color filter 230*c*, the transparent filter layer 410, and the plurality of first partitioning wall layers 420.

The first refractive layer 430 may be an insulation layer and, for example, may include a silicon oxide (SiOx).

Figure 7:
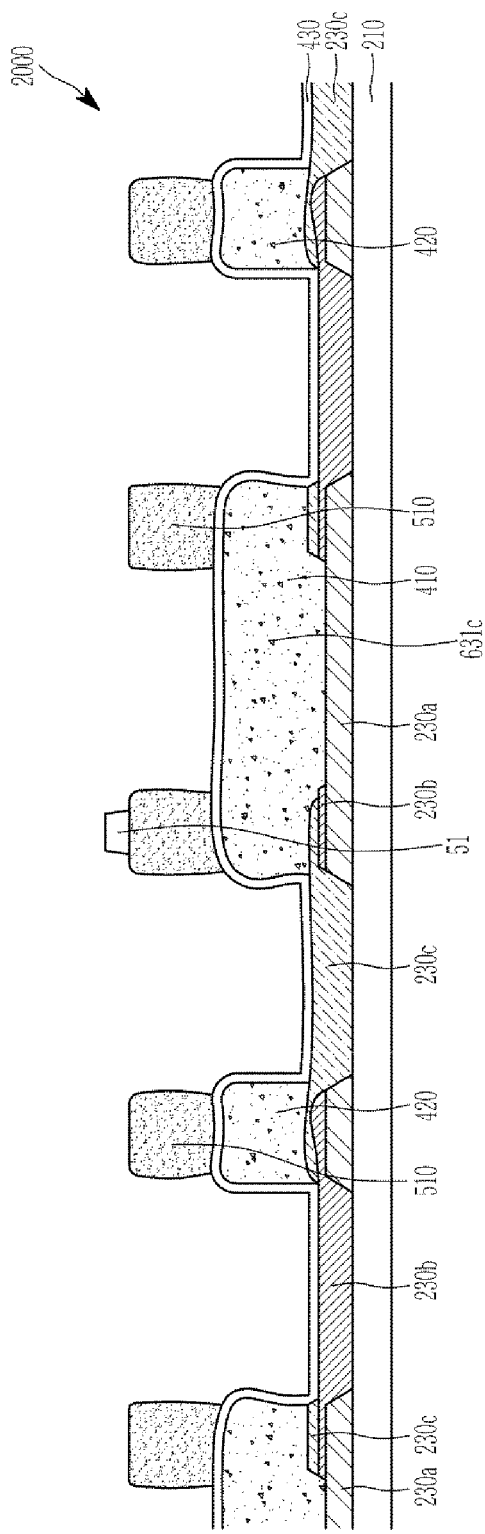

As shown in FIG. 7, a plurality of second partitioning wall layers 510 may be formed on the first refractive layer 430 to be overlapped with the edge portion of the transparent filter layer 410 and the plurality of first partitioning wall layers 420.

In this case, portions of the plurality of second partitioning wall layers 510 may be extended to form spacers 51.

Figure 8:
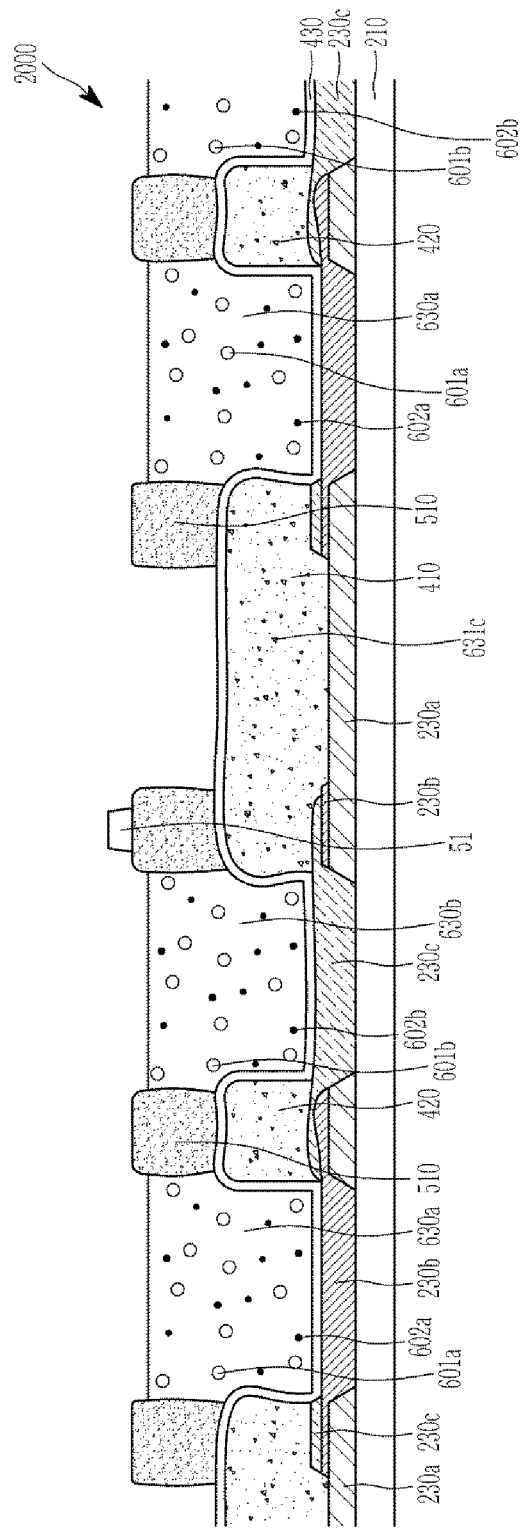

Referring to FIG. 8, a plurality of first color conversion layers 630a may be formed on a first refractive layer 430 of a region that overlaps the second color filter 230b among regions defined by the edge portion of the transparent filter layer 410, the plurality of first partitioning wall layers 420, and the plurality of second partitioning wall layers 510. Subsequently, a plurality of first color conversion layers 630a may be formed on a first refractive layer 430 of a region that overlaps the third color filter 230c among regions defined by the edge portion of the transparent filter layer 410, the plurality of first partitioning wall layers 420, and the plurality of second partitioning wall layers 510.

Next, a cover layer 710 is formed on the transparent filter layer 410, the first color conversion layer 630a, the second color conversion layer 630b, the plurality of second partitioning wall layers 510, and the spacer such that the color conversion panel 2000 shown in FIG. 2 is completed.

Figure 9:
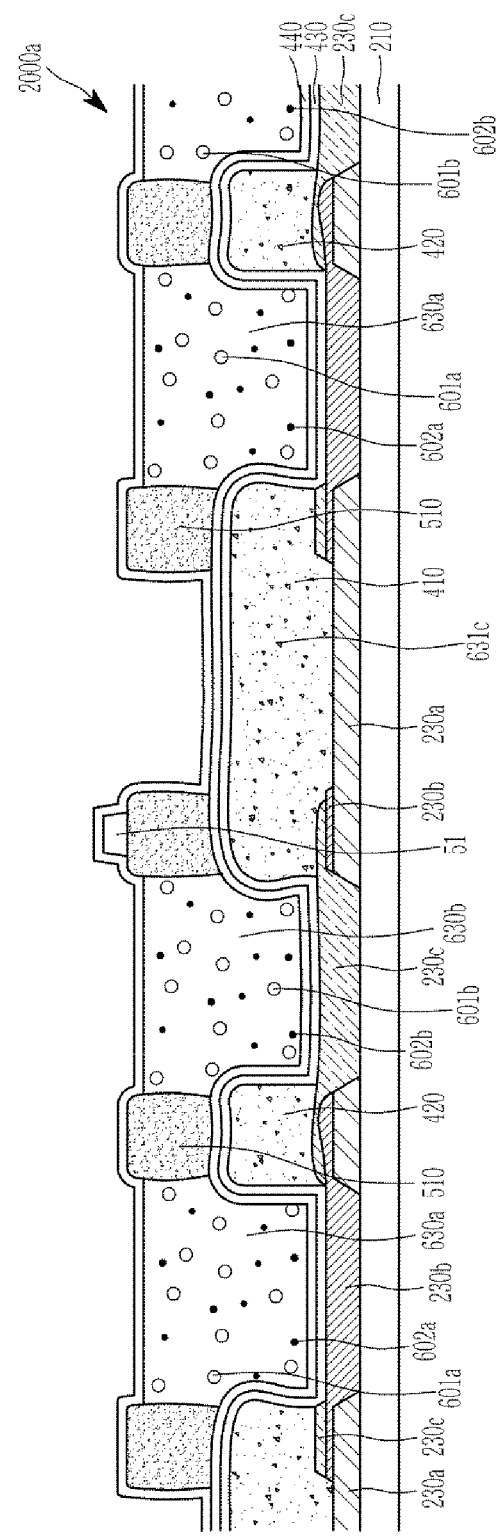
FIG. 9 is a cross-sectional view of a color conversion panel according to another embodiment.

Next, referring to FIG. 9, a color conversion panel according to another embodiment will be described. FIG. 9 is a cross-sectional view of a color conversion panel according to another embodiment.

Referring to FIG. 9, a color conversion panel 2000a according to the present embodiment is similar to the color conversion panel 2000 according to the embodiment described with reference to FIG. 1 to FIG. 3. A detailed description of the same constituent element will not be provided.

However, unlike the color conversion panel 2000 according to the embodiment described with reference to FIG. 1 to FIG. 3, the color conversion panel 2000a according to the present embodiment may further include a second refractive layer 440 on a first refractive layer 430.

The second refractive layer 440 may include an insulation layer like the first refractive layer 430, and may have a thickness that is different from that of the first refractive layer 430. In some embodiments, the second refractive layer 440 may have a different refractive index than the first refractive layer 430.

As previously described, first light Lin 1 incident on an edge portion of a transparent filter layer 410 and a plurality of first partitioning wall layers (e.g., walls of the layers) 420 in a portion in which a first color filter 230a, a second color filter 230b, and a third color filter 230c overlap each other is scattered by scatterers 631c included in the transparent filter layer 410 and the plurality of first partitioning wall layers 420 from the transparent filter layer 410, the first color conversion layer 630a, and the second color conversion layer 630b, and a path is changed such that second light Lout1 having a changed path may be re-emitted to the transparent filter layer 410, the first color conversion layer 630a, and the second color conversion layer 630b.

In some embodiments, from the transparent filter layer 410, the first color conversion layer 630a, and the second color conversion layer 630b, third light Lin2 incident on the first refractive layer 430 at a surface of the transparent filter layer 410 and the plurality of first partitioning wall layers 420 in a portion in which the first color filter 230a, the second color filter 230b, and the third color filter 230c overlap each other is refracted by the first refractive layer 430 on the first color filter 230a, the second color filter 230b, the third color filter 230c, the transparent filter layer 410, and the plurality of first partitioning wall layers 420 such that refracted fourth light Lout2 may be re-emitted to the transparent filter layer 410, the first color conversion layer 630a, and the second color conversion layer 630b.

In some embodiments, because the color conversion panel 2000a according to the present embodiment further includes the second refractive layer 440 on the first refractive layer 430, light incident on the second refractive layer 440 from the transparent filter layer 410, the first color conversion layer 630a, and the second color conversion layer 630b is additionally refracted at the interface between the first refractive layer 430 and the second refractive layer 440, and thus the refracted light may be re-emitted to the transparent filter layer 410, the first color conversion layer 630a, and the second color conversion layer 630b. In this case, the second refractive layer 440 has a different refractive index from that of the first refractive layer 430, and thus incident light may be refracted in different directions, thereby further increasing light efficiency.

As described, from the transparent filter layer 410, the first color conversion layer 630a, and the second color conversion layer 630b, the light incident toward the edge portion of the transparent filter layer 410 and the plurality of first partitioning wall layers 420 is scattered and refracted and then re-emitted toward the transparent filter layer 410, the first color conversion layer 630a, and the second color conversion layer 630b such that the light is transmitted or color-converted again and then radiated toward the second substrate 210, thereby increasing the light efficiency.

In some embodiments, because the second refractive layer 440 on the first refractive layer 430 is further included, from the transparent filter layer 410, the first color conversion layer 630a, and the second color conversion layer 630b, light incident toward the edge portion of the transparent filter layer 410 and the plurality of first partitioning wall layers 420 is re-refracted and then re-emitted to the transparent filter layer 410, the first color conversion layer 630a, and the second color conversion layer 630b, thereby further increasing light efficiency.

Many features of the color conversion panel 2000 according to the embodiment described above may be applicable to the color conversion panel 2000a according to the present embodiment.

Figure 10:
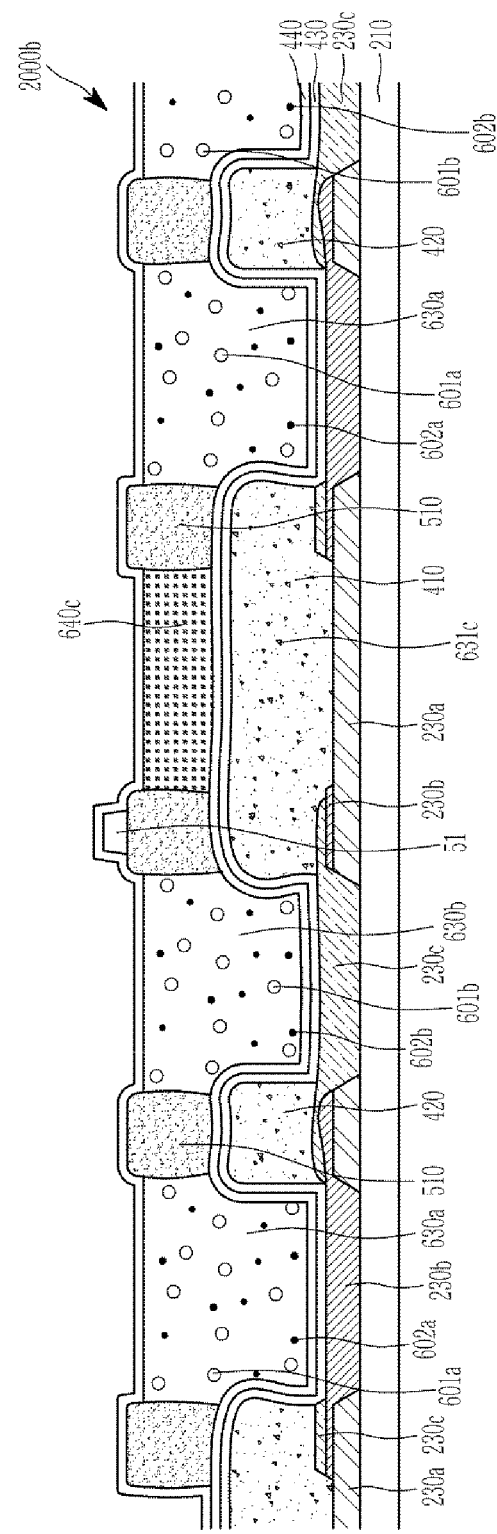
FIG. 10 is a cross-sectional view of a color conversion panel according to another embodiment.

Next, referring to FIG. 10, a color conversion panel 2000b according to another embodiment will be described. FIG. 10 is a cross-sectional view of a color conversion panel according to another embodiment.

Referring to FIG. 10, a color conversion panel 2000b according to the present embodiment is similar to the color conversion panel 2000 according to the embodiment described with reference to FIG. 1 to FIG. 3 and the color conversion panel 2000a according to the embodiment described with reference to FIG. 9. A detailed description of the same constituent element will not be provided.

However, unlike the color conversion panel 2000 according to the embodiment described with reference to FIG. 1 to FIG. 3 and the color conversion panel 2000a according to the embodiment described with reference to FIG. 9, the color conversion panel 2000b according to the present embodiment is on a transparent filter layer 410, and may further include a third color conversion layer 540c at a position surrounded by a plurality of second partitioning wall layers 510.

The third color conversion layer 640c may include a plurality of scatterers and quantum dots, and may include a color filter that transmits light of a first wavelength. Thereby, the purity of the light of the first wavelength can be further increased.

The height of the third color conversion layer 640c on a transparent filter layer 410 may be substantially the same as that of a first color conversion layer 630a and a second color conversion layer 630b, and thus there may be no step difference in layers in a region defined by a plurality of second partitioning wall layers 510. Therefore, it is possible to prevent or reduce deterioration of display quality such as stains due to the level difference between the display panel 1000 and the color conversion panel 2000, by reducing a step difference between a display panel 1000 and a color conversion panel 2000.

From a transparent filter layer 410, a first color conversion layer 630*a*, and a second color conversion layer 630*b*, light incident toward an edge portion of the transparent filter layer 410 and the plurality of first partitioning wall layers 420 is scattered and refracted and then re-emitted toward the transparent filter layer 410, the first color conversion layer 630*a*, and the second color conversion layer 630*b* such that the light is transmitted or color-converted again and then radiated toward a second substrate 210, thereby increasing the light efficiency.

In some embodiments, because the second refractive layer 440 on the first refractive layer 430 is further included, from the transparent filter layer 410, the first color conversion layer 630*a*, and the second color conversion layer 630*b*, light incident toward the edge portion of the transparent filter layer 410 and the plurality of first partitioning wall layers 420 is re-refracted and then re-emitted to the transparent filter layer 410, the first color conversion layer 630*a*, and the second color conversion layer 630*b*, thereby further increasing light efficiency.

Many features of the color conversion panels 2000 and 2000*a* according to the embodiment described above may be applicable to the color conversion panel 2000*b* according to the present embodiment.

Figure 11:
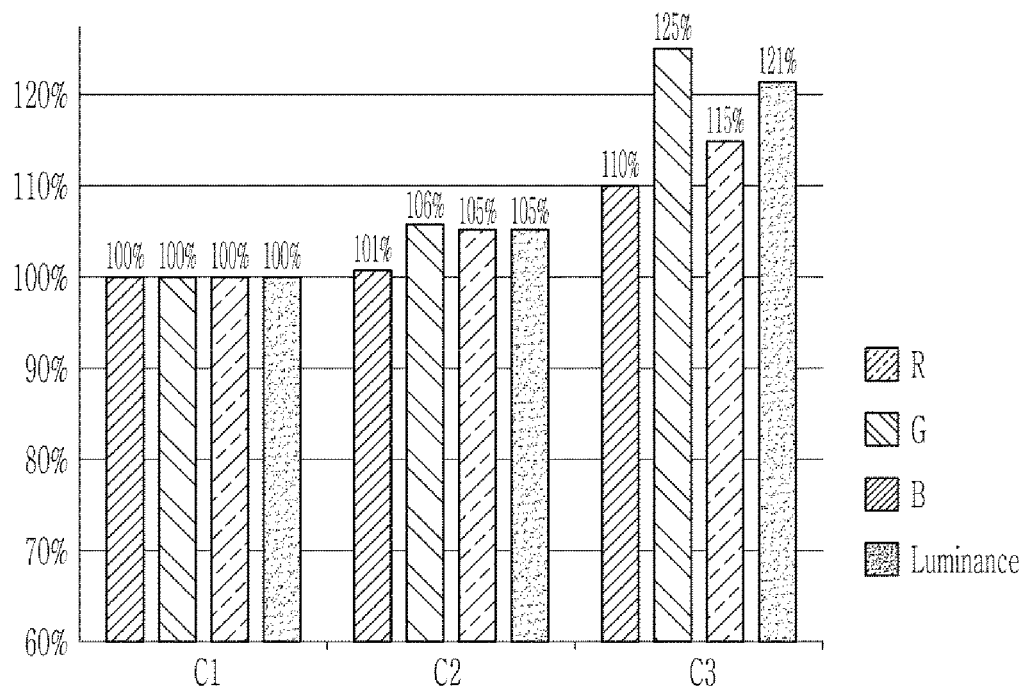
FIG. 11 is a graph of a result of an experimental example.

Hereinafter, referring to FIG. 11, a result of an experimental example will be described. FIG. 11 is a graph of a result of an experimental example.

In the present experimental example, efficiency and entire luminance of light R of a second wavelength, light G of a third wavelength, and light B of a first wavelength were measured with respect to a first case C in which an existing color conversion panel the defines a region where a plurality of color conversion layers may be formed with a plurality of second partitioning wall layers 510 without a plurality of first partitioning wall layers 420, a second case C2 in which a region where a plurality of color conversion layers may be formed is defined with a plurality of second partitioning wall layers 510 without a plurality of first partitioning wall layers 420, and a first refractive layer 430 is formed, and a third case C in which a region where a plurality of color conversion layers may be formed is defined with a plurality of first partitioning wall layers 420 and a plurality of second partitioning wall layers 510 as in the above-described embodiment, and a first refractive layer 430 is formed, and FIG. 11 illustrates the results of the measurement.

Referring to FIG. 11, the light efficiency and luminance of the second case C2 were higher than those of the first case C1, being increased by about 5% to 6%. And the light efficiency and luminance of the third case C3 were significantly increased by 10% or more compared to the first case C1.

As described, like the color conversion panel of the display devices according to the embodiment, in which the plurality of first partitioning wall layers 420 and the plurality of second partitioning wall layers 510 define a region where the plurality of color conversion layers may be formed, and the first refractive layer 430 is formed, efficiency of the light B of the first wavelength, the light R of the second wavelength, and the light G of the third wavelength increase, and accordingly, the overall luminance of the display device is also increased.

The use of "may" when describing embodiments of the inventive concept refers to "one or more embodiments of the inventive concept."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this disclosure has been described in connection with what is presently considered to be practical embodiments, it is to be understood that the present disclosure is not limited to the disclosed embodiments. In contrast, it is intended to cover one or more suitable modifications and equivalent arrangements included within the spirit and scope of the appended claims, and equivalents thereof.

REFERENCE NUMERALS

100: display device
1000: display panel
2000, 2000a, 2000b: color conversion panel
230a, 230b, 230c: color filter
410: transparent filter layer
420: first partitioning wall layer
430, 440: refractive layer
510: second partitioning wall layer
51: spacer
601a, 601b: quantum dot
602a: 602b, 631c: scatterer
630a, 630b, 640c: color conversion layer
710: cover layer
720: filling layer

What is claimed is:

1. A color conversion panel comprising:
a substrate;
a transparent filter layer;
a plurality of first partitioning wall layers, the transparent filter layer and the plurality of first partitioning wall layers being on the substrate;
a first refractive layer, the first refractive layer being on the transparent filter layer and the plurality of first partitioning wall layers;
a plurality of second partitioning wall layers, the plurality of second partitioning wall layers being on the first refractive layer, the second partitioning wall layers overlapping the plurality of first partitioning wall layers, and the first refractive layer being between the plurality of first partitioning wall layers and the plurality of second partitioning wall layers; and
a plurality of color conversion layers, the plurality of color conversion layers being on the first refractive layer, and in a region defined by the plurality of first partitioning wall layers and the plurality of second partitioning wall layers.

2. The color conversion panel of claim 1, wherein
the transparent filter layer and the plurality of first partitioning wall layers comprise a plurality of scatterers, and
the transparent filter layer and the plurality of first partitioning wall layers have photosensitivity.

3. The color conversion panel of claim 2, further comprising:
a first color filter;
a second color filter; and
a third color filter,
wherein the first color filter, the second color filter, and the third color filter are on the substrate,
wherein the transparent filter layer overlaps the first color filter, and
wherein the plurality of color conversion layers overlap the second color filter and the third color filter.

4. The color conversion panel of claim 3, wherein
the plurality of color conversion layers comprise a plurality of quantum dots.

5. The color conversion panel of claim 4, wherein
the transparent filter layer and the first color filter configured to transmit light of a first wavelength, and
the plurality of color conversion layers comprise:

a first color conversion layer, the first color conversion layer configured to color-convert the light of the first wavelength to light of a second wavelength; and
a second color conversion layer, the second color conversion layer configured to colorconvert the light of the first wavelength to light of a third wavelength.

6. The color conversion panel of claim 5, wherein
the first color conversion layer overlaps the second color filter,
the second color filter is to transmit the light of the second wavelength,
the second color conversion layer overlaps the third color filter, and
the third color filter is to transmit the light of the third wavelength.

7. The color conversion panel of claim 1, further comprising a second refractive layer,
wherein the second refractive layer is on the first refractive layer, and
wherein a refractive index of the first refractive layer is different from thatof the second refractive layer.

8. The color conversion panel of claim 7, further comprising a third color conversion layer, wherein the third color conversion layer t overlaps the transparent filter layer.

9. The color conversion panel of claim 8, wherein
a surface height of the third color conversion layer is substantially the same as an average surface height of the plurality of color conversion layers.

10. The color conversion panel of claim 9, wherein
the third color conversion layer comprises a quantum dot or a color filter.

11. The color conversion panel of claim 1, further comprising a third color conversion layer, wherein the third color conversion layer overlaps the transparent filter layer.

12. The color conversion panel of claim 11, wherein
a surface height of the third color conversion layer is substantially the same as an average surface height of the plurality of color conversion layers.

13. The color conversion panel of claim 12, wherein
the third color conversion layer comprises a quantum dot or a color filter.

14. A display device comprising:
a first substrate;
a pixel electrode, the pixel electrode being on the first substrate;
a pixel defining film, the pixel defining film being on the pixel electrode and comprising an opening overlapping the pixel electrode;
an emission layer, the emission layer being in the opening overlapping the pixel electrode;
a common electrode, the common electrode being on the emission layer;
a second substrate, the second substrate facing the first substrate;
a transparent filter layer;
a plurality of first partitioning wall layers, the transparent filter layer and the plurality of first partitioning wall layers being between the first substrate and the second substrate;
a first refractive layer, the first refractive layer being between the first substrate and the transparent filter layer and between the first substrate and the plurality of first partitioning wall layers;
a plurality of second partitioning wall layers, the plurality of second partitioning wall layers being between the first refractive layer and the first substrate and the plurality of second partitioning wall layers overlapping the plurality of first partitioning wall layers; and a plurality of color conversion layers, the plurality of color conversion layers being between the first refractive layer and the first substrate.

15. The display device of claim 14, wherein the transparent filter layer and the plurality of first partitioning wall layers comprise a plurality of scatterers, the transparent filter layer and the plurality of first partitioning wall layers have photosensitivity, and the plurality of color conversion layers comprise a plurality of quantum dots.

16. The display device of claim 15, further comprising: a first color filter; a second color filter; and a third color filter, wherein the first color filter, the second color filter, and the third color filter are between the second substrate and the transparent filter layer and the plurality of first partitioning wall layers, wherein the transparent filter layer overlaps the first color filter, wherein the plurality of color conversion layers overlap the second color filter and the third color filter, wherein the transparent filter layer and the first color filter are to transmit light of a first wavelength, wherein the plurality of color conversion layers comprise:
 a first color conversion layer, the first color conversion layer being to color-convert the light of the first wavelength to light of a second wavelength; and
 a second color conversion layer, the second color conversion layer being to color-convert the light of the second wavelength to light of a third wavelength, wherein the first color conversion layer overlaps the second color filter, wherein the second color filter is to transmit the light of the second wavelength, wherein the second color conversion layer overlaps the third color filter, and wherein the third color filter is to transmit the light of the third wavelength.

17. The display device of claim 15, further comprising a second refractive layer, wherein the second refractive layer is between the first refractive layer and the first substrate, and wherein the first refractive layer and the second refractive layer have different refractive indexes.

18. The display device of claim 17, further comprising a third color conversion layer, wherein the third color conversion layer overlaps the transparent filter layer, and wherein a surface height of the third color conversion layer is substantially the same as an average surface height of the plurality of color conversion layers.

19. The display device of claim 18, wherein the third color conversion layer comprises a quantum dot or a color filter.

20. The display device of claim 15, further comprising a third color conversion layer, wherein the third color conversion layer overlaps the transparent filter layer, and wherein a surface height of the third color conversion layer is substantially the same as an average surface height of the plurality of color conversion layers.

* * * * *